(12) United States Patent
Efimov et al.

(10) Patent No.: US 8,301,983 B2
(45) Date of Patent: Oct. 30, 2012

(54) MODIFIED TURBO-DECODING MESSAGE-PASSING ALGORITHM FOR LOW-DENSITY PARITY CHECK CODES

(75) Inventors: Andrey Gennadievich Efimov, St. Petersburg (RU); Andrey Vladimirovich Belogolovy, Saint Petersburg (RU)

(73) Assignee: Intel Corporation, Santa Clara, CA (US)

( * ) Notice: Subject to any disclaimer, the term of this patent is extended or adjusted under 35 U.S.C. 154(b) by 579 days.

(21) Appl. No.: 11/992,802

(22) PCT Filed: Sep. 30, 2005

(86) PCT No.: PCT/RU2005/000489

§ 371 (c)(1),
(2), (4) Date: Feb. 12, 2010

(87) PCT Pub. No.: WO2007/037713

PCT Pub. Date: Apr. 5, 2007

(65) Prior Publication Data

US 2010/0146371 A1    Jun. 10, 2010

(51) Int. Cl.
*G06F 11/00*    (2006.01)
(52) U.S. Cl. ...................................... 714/780
(58) Field of Classification Search ............. 714/746, 714/786, 800–801, 780
See application file for complete search history.

(56) References Cited

U.S. PATENT DOCUMENTS

2008/0263425 A1 * 10/2008 Lakkis .......................... 714/752

OTHER PUBLICATIONS

Djordjevic et al., Generalized Low-Density Parity Check Codes for Optical Communication Systems, May 2005, IEEE, Journal of Lightwave Tech., vol. 23, No. 5, p. 1939-1946.*
Zhang et al., Hihg performance, low complexity decoding of generalized low density parity check codes, 2001, IEEE, p. 181-185.*
Mansour, M. M., et al., "Architecture-Aware Low-Density Parity-Check Codes", *Proceedings of the 2003 IEEE Int'l Symposiumon Circuits and Systems*, 2 of 5, (May 25, 2003),II-57.
Mansour, M. M., "High-Performance Decoders for Regular and Irregular Repeat-Accumulate Codes", *Global Telecommunications Conference*, (Nov. 29, 2004),2583-2588.
Mansour, M. M., "High-throughput LDPC decoders", *IEEE Transactions on Very Large Scale Integration (VLSI) Systems*, 11(6), (Dec. 2003),976-996.
Mansour, M. M., et al., "Memory-Efficient Turbo Decoder Architectures for LDPC Codes", *Signal Processing Systems, IEEE Workshop*, (Oct. 16-18, 2002),159-164.
Mansour, M. M., "VLSI Design for High-Speed Sparse Parity-Check Matrix Decoders", *Signals, Systems and Computers*, (Oct. 28, 2005),708-712.
Ryan, W. E., "Institute of Electrical and Electronics Engineers: A Turbo Code Tutorial", *IEEE Global Telecommunications Conference*, 1, (2001),1-9.

* cited by examiner

*Primary Examiner* — Shelly A Chase
(74) *Attorney, Agent, or Firm* — Schwegman, Lundberg & Woessner, P.A.

(57) ABSTRACT

Apparatus and methods are provided to decode signals from a communication channel to reconstruct transmitted information. Embodiments may include applying a plurality of decoders to a code, in which reliability values are provided to a decoder such that the decoder receives the reliability values determined by and provided from only one other decoder of the plurality of decoders. A valid codeword may be output from application of the plurality of decoders to the code.

23 Claims, 4 Drawing Sheets

MODIFIED TURBO-DECODING MESSAGE-PASSING ALGORITHM FOR LOW-DENSITY PARITY CHECK CODES

RELATED APPLICATION(S)

This application is a U.S. National Stage Filing under 35 U.S.C. 371 from International Patent Application Serial No. PCT/RU2005/000489, filed Sep. 30, 2005, and published on Apr. 5, 2007 as WO 2007/037713 A1, which is incorporated herein by reference.

TECHNICAL FIELD

Embodiments of the invention relate generally to decoding communication signals.

BACKGROUND

A communication channel, whether it is a fiber optic channel, a co-axial channel, a wired channel, a wireless channel, or a bus connecting locations in a system over which large amounts of data are transferred, can add noise and error to information being transmitted over the channel. To correct for errors added by the communication channel, information can be sent in the form of codewords, where each codeword contains the same number of total bits and in which a number of the bits are information (message) bits and a number of bits are used for error correction. A codeword having a length of n bits includes k bits for the message length of the code and r=n−k redundant bits. The r bits are for correction and may be r parity check bits. A parity check matrix, H, contains a set of parity check equations that define the codeword according to the relation:

$$HC^T = 0,$$

where C is the n-dimensional vector of the codeword bits. At a receiver if this relation is not satisfied, then the received codeword is not valid and must either be corrected or retransmitted.

A variety of schemes for decoding a codeword that has propagated through a communication channel exist. Some schemes may provide accuracy and other schemes may provide fast decoding. In high speed data communication what is needed is a decoding scheme that is accurate and fast, but at the same time can be implemented without a significant amount of complexity.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the present invention. Other embodiments may be utilized and structural, logical, and electrical changes may be made without departing from the scope of the invention. The various embodiments disclosed herein are not necessarily mutually exclusive, as some embodiments can be combined with one or more other embodiments to form new embodiments. The following detailed description is, therefore, not to be taken in a limiting sense.

Figure 1:
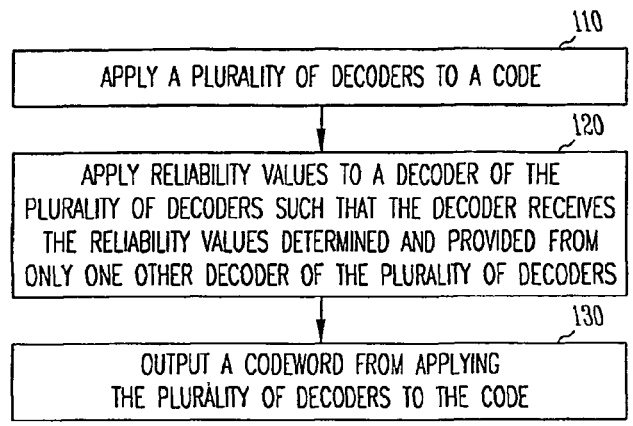
FIG. 1 shows a flow diagram of features of an embodiment of a method for decoding information received from a communication channel.

FIG. 1 shows a flow diagram of features of an embodiment of a method for decoding information received from a communication channel. At 110, a plurality of decoders may be applied to a code. At 120, reliability values may be applied to a decoder of the plurality of decoders. These reliability values may used by the decoder that receives these values to operate on the code. The decoder may receive the reliability values from only one other decoder of the plurality of decoders, where these reliability values are determined by and output from this one other decoder. In an embodiment, each decoder receives reliability values output from another decoder. In an embodiment, the plurality of decoders may be configured in a selected order with each decoder having an output of reliability values to be used by the next decoder in the selected order. The last decoder in the selected order may provide reliability values for the first decoder in the selected order to provide an arrangement for iteratively decoding a code. The code may be included in a signal received from a communication network.

At 130, a codeword from applying the plurality of decoders to the code may be output from the decoder. The codeword may be a codeword corrected in the decoding process. If the application of the plurality of decoders to the code does not provide a valid codeword, an error may be assumed to have occurred. In an embodiment, a message regarding the error may be generated and provided to an appropriate apparatus or system.

Various embodiments of information decoding may be implemented in forward error correction (FEC) for 10 Gigabit (10 G) Ethernet, wireless Ethernet, high-speed modems, and other communication systems. In an embodiment, a method similar to the method illustrated in FIG. 1 may be implemented to provide a modified turbo-decoding message-passing algorithm to decoding information. An embodiment of such a modified turbo-decoding message-passing algorithm may be realized in a decoder as hardware, software executing instructions directed by a controller, or a combination of hardware and software executing instructions directed by a controller.

In an embodiment, soft decision decoding may be applied to a signal received from a communication, where the signal contains code having message information. A soft decision decoder may include using hard decisions at various points in the decoding process. A hard decision may be made on a bit by evaluating that bit individually. For a hard decision on a binary bit, the decoder makes the bit a 1 or a 0 if the bit is less than or greater than a fixed value set by the decoder. With the fixed value set by the decoder at zero, a hard decision would set a bit equal to 1 if the received signal for the bit is positive and set the bit equal to 0 if the received signal is negative. Alternatively, a hard decision may set a bit equal to 1 if the received signal for the bit is negative and set the bit equal to 0 if the received signal is positive.

A soft decision is one in which the likelihood that a bit should represent a discrete value is taken into account when determining the value of the bit from the received signal. Soft decision decoders may use information relating to the confidence of received signal (soft received information) and information of the properties of the channel to provide probabilistic expressions for a received signal relative to the transmitted signal. While a hard decision for a binary process provides a hard decision vector where the vector locations, or vector bits, may be either a one or a zero, a soft decision may provide a hard decision vector and a reliabilities, or bit reliabilities, vector. The binary hard decision vector provided by the soft decision is a vector of ones and zeros, where each vector bit is generated individually with respect to a fixed criterion. A reliabilities vector may include a set of bit reliabilities, each bit reliability corresponding to a bit of an associated hard decision vector. The bit reliability provides a measure of its confidence of the corresponding bit in the hard decision vector. The bit reliability may take the form of a probability, a log-likelihood ratio, or other weighted factor correlated to the communication channel through which a received codeword is transmitted. As is known to those skilled in the art, various decoding schemes implement soft decoding schemes using probabilities. One scheme in its soft decision processes computes the a posteriori probability for each codeword bit, which is the probability that the given bit is a one conditioned on the event that all parity check constraints are satisfied. An intrinsic or a priori probability is the bit probability independent of code constraints and an extrinsic probability represents what has been learned.

Iterative decoding in various schemes may include updating reliability information corresponding to received bits, and/or updating the reliability corresponding to non-zero elements of the parity check matrix, H. Such iterative processes may include checking an updated test codeword, x, for validity via the relation, $Hx^T=0$. If the test does not result in a valid codeword, the iterative process continues until a valid codeword is obtained or a maximum number of iterations are made. The code may contain information to facilitate error correction techniques to extract the message from received communication signals. In an embodiment, the code may be a low-density parity check (LDPC) code. The code may be implemented for transmission in various networks including, but not limited to, high-speed local area networks, wireless communications, and fiber-optic communications.

Low-density parity check codes provide a powerful forward error correcting tool in high-speed communication systems due to the low decoding complexity and the bit-error rate (BER) achieved in an additive white Gaussian noise (AWGN) channel. LDPC codes use a parity check matrix containing mostly zeros and a limited number of ones. A binary (n, γ, ρ) LDPC code has a codeword length, or block length, of n bits and a parity check matrix with exactly γ ones in each column and exactly ρ ones in each row. In the LDPC code, each code bit is checked by γ parity checks and each parity check uses ρ code bits. Further, the code has a rate, R, defined as R=k/n, where k is the number of message (information) bits in the codeword having n bits.

An LDPC code is a linear block code defined by a sparse parity-check matrix $H=[h_{ij}]_{m \times n}$. The rows of H correspond to check nodes $\{c_1, c_2, \ldots, c_m\}$ and the columns of H correspond to n bit nodes $\{b_1, b_2, \ldots, b_n\}$. A bit-node $b_j$ is connected to a check node $c_i$ if the entry $h_{ij}$ is 1. In a regular (c,r)-LDPC code, bit nodes have degree c and check nodes have degree r. The numbers c and r are fixed for a regular (c,r)-LDPC code. If an LDPC code is not described by a regular parity-check matrix, it is an irregular-LDPC code, in which the bit-node and check node degrees are drawn from two sets.

LDPC codes may be decoded using turbo decoding principles. Such a decoding process includes using a turbo-decoding message-passing (TDMP) algorithm. Ensembles of regular (c,r)-LDPC codes of length n may be constructed by representing the parity-check matrix $[h_{ij}]_{m \times n}$ of a code C as a concatenation of c submatrices, each containing a single 1 in each column. The first of these submatrices $H^1$ having size (n/r)×n defines a supercode $C^1$ as the direct sum of n/r parity-check (r, r−1)-subcodes. $C^1$ satisfies a subset of the parity-check equations of C, and hence C is a subspace of $C^1$. The other submatrices, $H^1, \ldots, H^c$ are pseudorandom permutations of $H^1$, each of which defines a supercode $C^j$ on the corresponding subset of the parity-check equations. Hence, C is the intersection of the supercodes $C^1, \ldots, C^j$. LDPC decoding may be transformed into a turbo-decoding process by decomposing the parity-check matrix of an LDPC code in such a way as to restrict the column positions of the ones. In turbo-decoding, messages flow in tandem only between the adjacent supercodes as opposed to potentially all the subcodes, absent any structure on the parity-check matrix. In a turbo-principle for decoding, the parity-check matrix of the code may be divided into stripes (subsets of rows of the parity-check matrix) and decoding may be conducted stripe by stripe. The decoder may decode a second stripe, which is a second sub-iteration, using updated reliabilities obtained during the first decoding. The interleavers for turbo decoding of LDPC coded may be factored into smaller interleavers.

Figure 2:
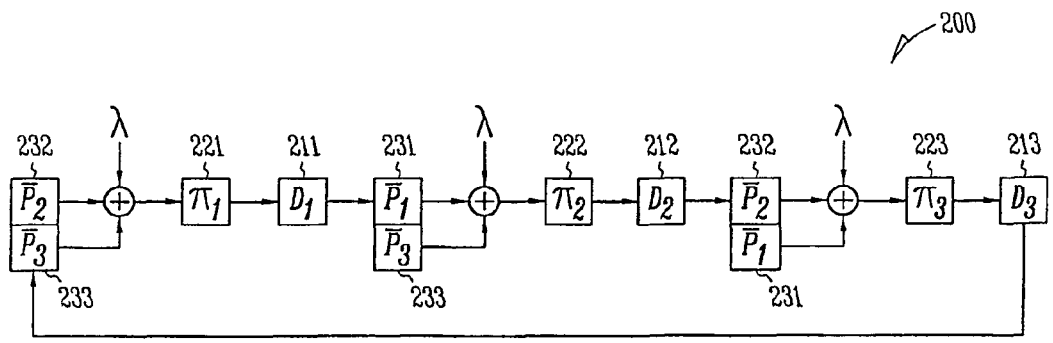
FIG. 2 shows a block diagram of a classic turbo-decoding message-passing decoder to decode an LDPC code.

FIG. 2 shows a block diagram of a classic turbo-decoding message-passing decoder 200 to decode an LDPC code. Such classic TDMP algorithm and TDMP decoders are known to those skilled in the art. Consider the TDMP algorithm associated with FIG. 2 operating on regular LDPC codes. The algorithm applies to irregular codes as well. Let parity-check matrix H define a regular (c,r)-LDPC code C. Using TDMP decoder 200, for each bit, extrinsic reliability values are computed using the decoder $D_1$, 211, assuming that the bit belongs to the first code $C^1$. This extrinsic information is fed as a priori information through an interleaver 222 to the decoder $D_2$, 212, for $C^2$. The second decoder updates the extrinsic reliability values assuming that the bits belong to $C^2$. The process is repeated with decoder $D_3$, 213, where at decoder 213 it is assumed that the bits belong to $C^3$. A single update of messages based on one supercode is referred to as a sub-iteration, and a round of updates across all the supercodes constitutes a single decoding iteration. Hard decisions are made based on the a posteriori reliability values read (after de-interleaving) from the decoder operating on the last supercode $C^3$.

A regular (c, r)-LDPC code $C=C^1 \cap C^2 \cap \ldots \cap C^c$ of length n defined by its parity-check matrix $H=[H^1; H^2; \ldots; H^c]$ is provided as input to decoder 200. Permutations $\{\pi_1, \ldots, \pi_c\}$ group the bits of each subcode to implement recursions of a Balh-Cocke-Jelinek-Raviv (BCJR) algorithm. As understood by one skilled art, a BCJR algorithm is an iterative maximum a posteriori (MAP) algorithm. Intrinsic channel reliability values, $\lambda_j$, j=1, . . . , n, are provided to the interleavers 221, 222, 223 that precede decoders 211, 212, and 213, respectively. A channel reliability of a bit, which is typically referred to as an intrinsic reliability, may be computed on reception from a communication channel. The output from decoder 200 is a codeword x such that $xH^T=0$ or a "decoding error". The decoding error may be provided to another apparatus or system. Memory buffers may be used to store reliability values. Reliability values $P_j$, $j=1, \ldots, n$, where $P_j^i$ denotes the i-th element of $P_j$, may be stored in n memory buffers, 231, 232, and 233, of size c. These memory buffers may be initialized to zero. FIG. 2 illustrates a (3,)-LDPC code having 3 supercodes.

At iteration k, c decoding sub-iterations corresponding to supercodes $C^i$, $i=1, \ldots, c$ may be performed. At sub-iteration t, the extrinsic reliabilities $Q_j$, $j=1, \ldots, N$, may be computed using the channel values $\lambda_j$, and assuming that $P_j$ is prior information that the codeword belongs to all supercodes except the t-th supercode. The prior information of $P_j$ includes the information that is obtained during a previous decoding iteration and is used in a current iteration. This computation can be performed using the BCJR algorithm or using the equation $$Q_j = \psi^{-1}\left[\sum_{j' \in S_t[j]\setminus\{j\}} \psi\left(\left|\lambda_{j'} + \sum_{\substack{i=1 \\ i \neq t}}^{c} P_{j'}^i\right|\right)\right] \cdot \delta_{S_t}[j], \quad (1)$$

where $\psi^{-1}(x)=\psi(x)=-0.5 \ln(\tan h(x/2))$, $S_t[j]$ is the set of column indices of the bits of the subcode in $C^1$ that contains bit j, and $\delta_{S_t}[j]$ is a sign-correction term that depends on the size of $S_t[j]$ and the sign of the arguments of $\psi(|.|)$. The quantity $\delta_{S_t}[j]$ can be computed as $$\delta_{S_t}[j] = (-1)^{|S_t[j]|} \prod_{j' \in S_t[j]\setminus\{j\}} \text{sgn}(\psi(|\cdot|)).$$

The value of $Q_j$ may be saved in $P_j^i$ for j=1, n. At the final sub-iteration t=c, a hard decisions made be made to generate a test codeword x=sgn(Q). The operation $xH^T=0$ is applied to test codeword x to determine if it is valid codeword.

Figure 3:
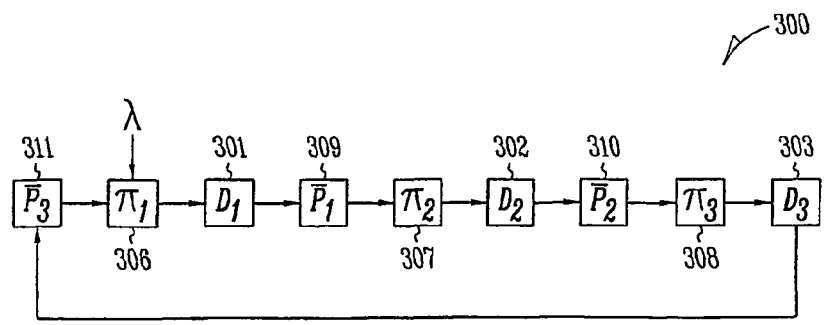
FIG. 3 shows a block diagram of an embodiment of a modified turbo-decoding message-passing decoder to decode an LDPC code.

FIG. 3 shows a block diagram of an embodiment of a modified turbo-decoding message-passing decoder 300 to decode an LDPC code. FIG. 3 illustrates a modified TDMP decoder for (3,)-LDPC code having 3 supercodes. Embodiments are not limited to a 3 supercodes, but may be constructed for any number of supercodes. Decoder 300 includes decoders 301, 302, and 303 having inputs provided from interleavers 306, 307, and 308, respectively, where reliability values may be stored in memory buffers, 309, 310, and 311. In an embodiment, memory buffers 309, 310, and 311 may be reduced to one memory buffer. In an embodiment, decoder 300 injects channel reliability values into the plurality of decoder 301, 302, and 303 once at the first sub-iteration of the first iteration. The channel reliability may be injected into only the first of decoders arranged in a selected order. Each decoder 301, 302, and 303 receives reliability values computed by and provided from the decoder directly preceding it.

In an embodiment, a modified turbo-decoding message-passing algorithm is constructed decoding LDPC codes in a soft-output channel process. Embodiments for decoders based on a modified TDMP algorithm may provide enhanced error-correcting properties as compared with a classic TDMP decoder. In an embodiment, a modified TDMP reliability decoder for fast LDPC decoding may be provided using a rule for output reliabilities computation on each sub-iteration different from that of a classic TDMP algorithm. The classic TDMP algorithm uses the sum of channel input reliabilities and reliabilities of all supercodes except the t-th supercode as input reliabilities for the t-th supercode. In an embodiment for a modified TDMP algorithm, the output reliabilities of the (t−1)-th supercode are utilized as input reliabilities for the t-th supercode. In an embodiment, $$Q_j = \psi^{-1}\left[\sum_{j' \in S_t[j]\setminus\{j\}} \psi\left(\left|P_{j'}^{1+(i-1)\bmod c}\right|\right)\right] \cdot \delta_{S_t}[j],$$

where $P_{j'}^{1+(i-1)\bmod c}$ is the output reliabilities of the symbols of the (i−1)-th supercode. Since decoder 300 does not provide multiple reliability values to one decoder computed from all the other decoders, decoding complexity and memory usage may be reduced from than of classic TDMP algorithm.

Figure 4:
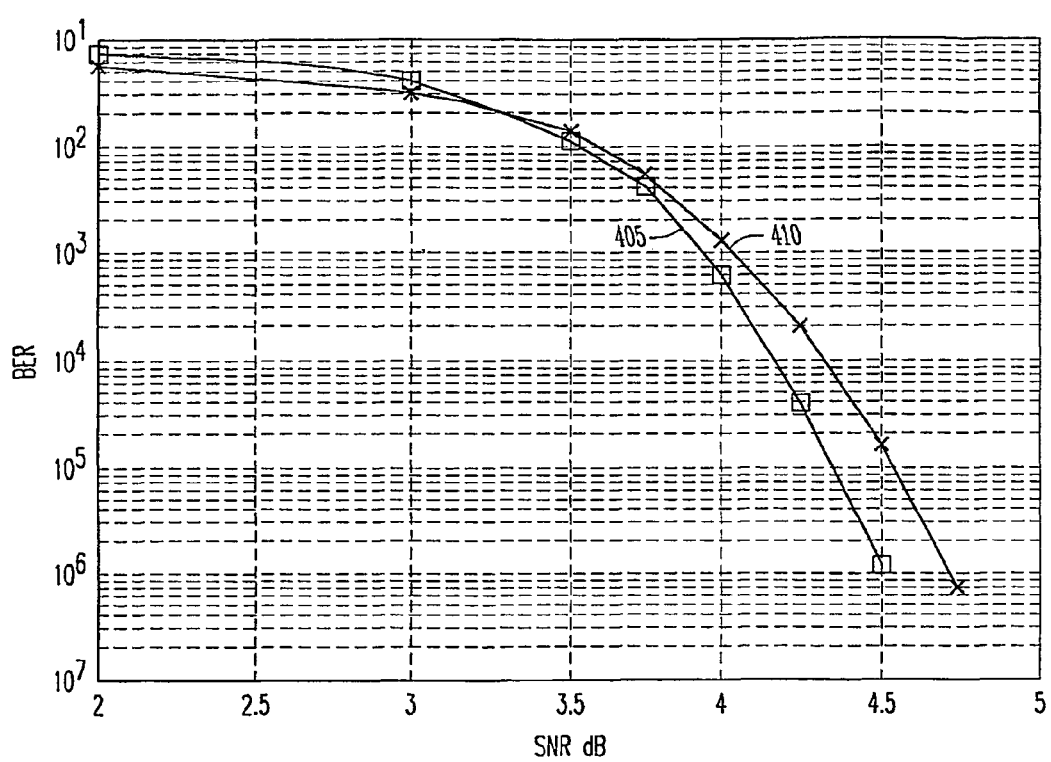
FIG. 4 shows a comparison of decoding performance using a turbo-decoding message-passing algorithm with respect to an embodiment using a modified turbo-decoding message-passing algorithm in regards to a bit error rate.

FIG. 4 shows a comparison of decoding performance using a turbo-decoding message-passing algorithm with respect to an embodiment using a modified turbo-decoding message-passing algorithm in regards to a bit error rate. The decoder shown in FIG. 4 is simulated for a AWGN channel using a Reed Solomon LDPC code construction, RS-LDPC (2048, 1723), having a code length of 2048 and a message length of 1723. Curve 405 for an embodiment of a modified TDMP decoder demonstrates an enhanced BER performance as a function of signal-to-noise ratio, SNR, with respect to curve 410 for a classic TDMP decoder.

Figure 5:
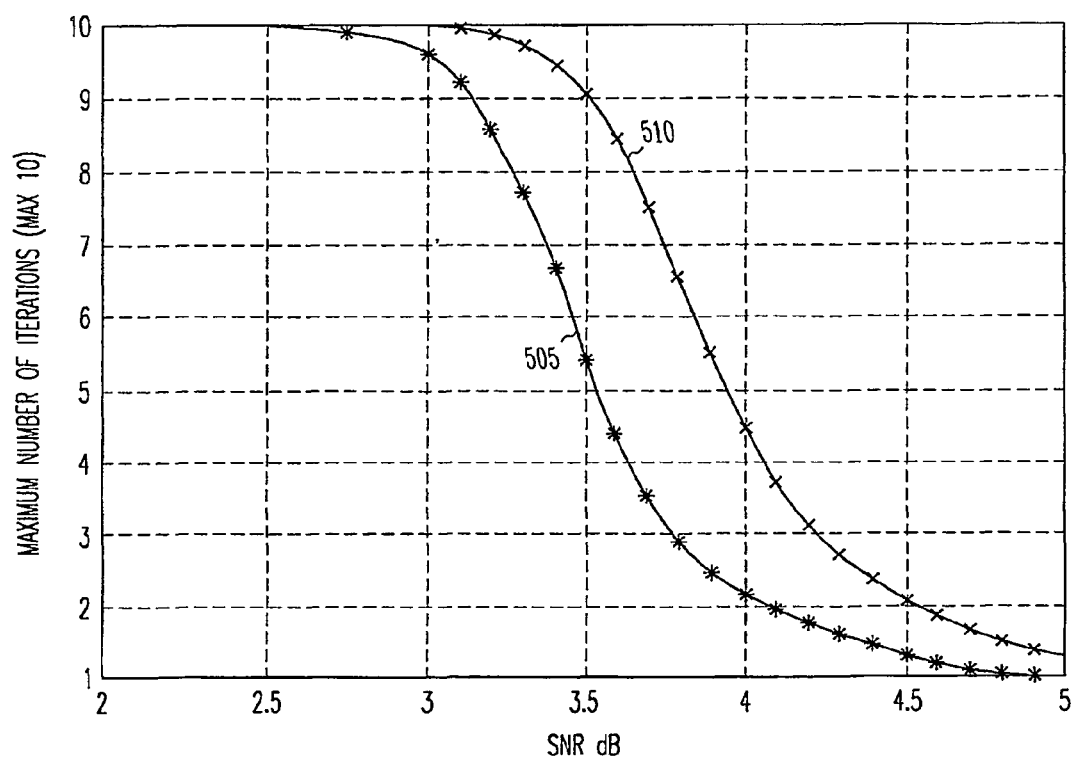
FIG. 5 shows a comparison of decoding performance using a turbo-decoding message-passing algorithm with respect to an embodiment using a modified turbo-decoding message-passing algorithm in regards to the average number of iterations used for decoding.

FIG. 5 shows a comparison of decoding performance using a turbo-decoding message-passing algorithm with respect to an embodiment using a modified turbo-decoding message-passing algorithm in regards to the average number of iterations used for decoding. The decoder shown in FIG. 5 is simulated for a AWGN channel using a RS-LDPC (2048, 1723) code. Curve 505 for an embodiment of a modified TDMP decoder demonstrates operation using fewer iterations for decoding as a function of SNR with respect to curve 510 for a classic TDMP decoder.

Various embodiments or combinations of embodiments for apparatus and methods for decoding communication signals using embodiments applying a plurality of individual decoders to a code, as described herein, can be realized in hardware implementations, software implementations, and combinations of hardware and software implementations. These implementations may include a machine-readable medium having machine-executable instructions for performing an embodiment for decoding by applying a plurality of decoders to a code, in which reliability values are applied to a decoder from the set of decoders such that the decoder receives the reliability values determined by and provided from only one other decoder of the decoder set. The instructions may direct the output of a valid codeword from application of the plurality of decoders to the code. In an embodiment, the machine-executable instructions may include instructions to decode an LDPC code. The LDPC may be decoded using instructions to implement an embodiment of a modified turbo-decoding message-passing algorithm. The machine-readable medium is not limited to any one type of medium. The machine-readable medium may include a computer-readable medium. The machine-readable medium used will depend on the application using an embodiment of the decoding scheme. In an embodiment, a processor coupled to a communication unit having an embodiment of a decoder may utilize the machine-readable medium and various forms of memory to direct decoding of information received from a communication channel. In an embodiment, the memory may store parameters used to iteratively decode the received codeword.

Figure 6:
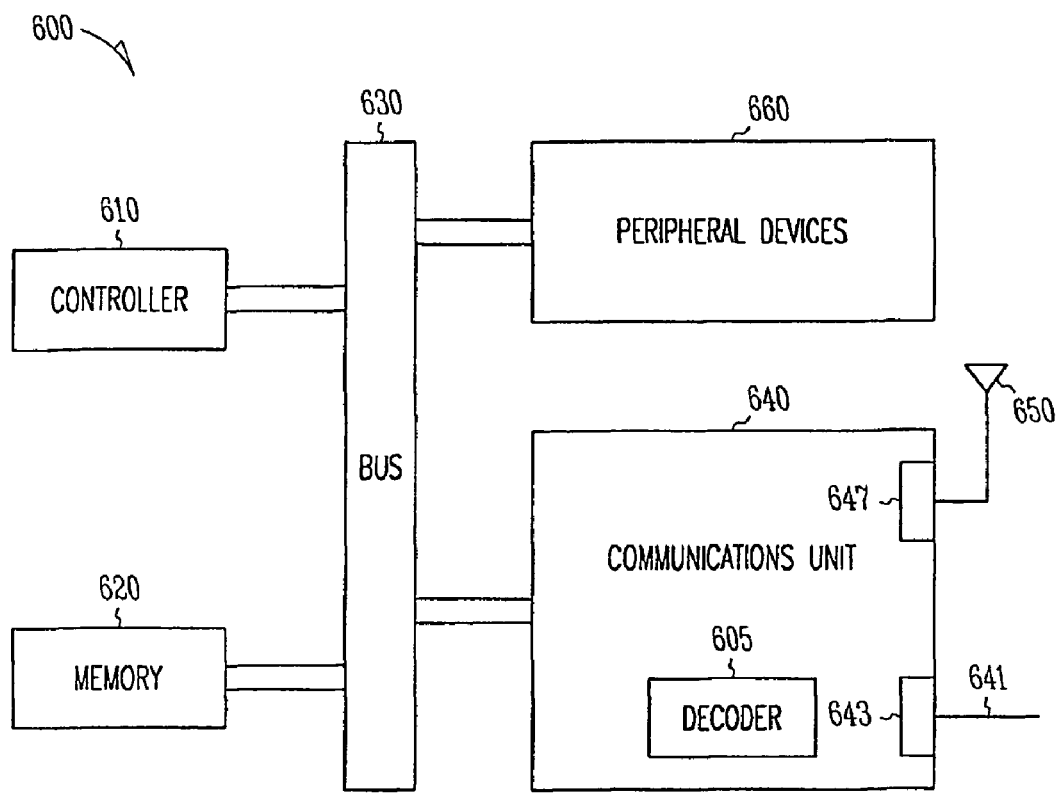
FIG. 6 illustrates a block diagram of an embodiment of a system having an embodiment of a decoder operating similar to the method shown in FIG. 1.

FIG. 6 illustrates a block diagram of an embodiment of a system 600 having an embodiment of a decoder 605 operating similar to the method shown in FIG. 1. Decoder 605 may be realized with a hardware architecture, a software based architecture, or combination of hardware/software architecture. In an embodiment, decoder 605 may be a modified turbo-decoding message-passing decoder arranged as in FIG. 3. System 600 may also include a controller 610 and a bus 630, where bus 630 provides a communication path between controller 610 and a communication unit 640. In an embodiment, controller 610 is a processor. Bus 630 may be a parallel bus. Bus 630 may be a serial bus. Bus 630 may be compatible with Peripheral Component Interconnect (PCI) or with PCI express. An embodiment, system 600 may include a memory 620 and an additional peripheral device or devices 660 coupled to bus 630. Peripheral devices 660 may include displays, memory, or other control devices that may operate in conjunction with controller 610, communication unit 640, and/or decoder 605.

Various embodiments for system 600 may be realized. System 600 may be arranged as a node, or a component of a node, in a network. The network may have a number of nodes, where each node may represent processing systems having a physical layer (PHY) entity arranged to operate in accordance with 10 GBase-T as defined by the IEEE 802.3an series of standards, for example. The 10 GBase-T PHY may interface with, for example, a 10 G media access control (MAC) and Gigabit Media Independent Interface (XGMII) in an IEEE architecture. The 10 GBase-T PHY may include part of a network interface card (NIC), for example. A network node may be realized as one or more systems. A network node may include any processing system and/or communications device suitable for use with a 10 GBase-T device. For example, network nodes may be implemented as a pair of switches, a pair of routers, a pair of servers, a switch and a router, a switch and a server, a server and a router, and so forth. In addition, network nodes also may be part of a modular system in which 10 GBase-T is the high-speed connection for the system. Further example, network nodes may include high-end servers, supercomputers, clusters, grid computing, workgroup switch uplinks, aggregation uplinks, storage systems, and so forth. The embodiments are not limited in this context.

Communication unit 640 may include decoder 605. Decoder 605 may be a separate module in system 600 operatively coupled to communication unit 640 to receive communication signals. In an embodiment, communication unit 640 may include a network interface card. In an embodiment, communication unit 640 may a communications device suitable for use with a 10 GBase-T device. In a wireless embodiment, communication unit 640 may include a connection 647 to couple to an antenna 650. In an embodiment, antenna 650 may be a substantially omnidirectional antenna. Communication unit 640 may include a connection 643 to couple to a transmission medium 641. Transmission medium 641 may be an optical fiber medium. Transmission medium 641 may couple to a wired network. Transmission medium 641 may be cable. Transmission medium 641 may include a coaxial cable, an unshielded twisted pair cable, or a shielded twisted pair cable.

System 600 may include, but is not limited to, information handling devices, wireless systems, telecommunication systems, fiber optic systems, electro-optic systems, and computers. Embodiments for a decoding scheme similar to those described herein may be adapted to be used in any system operating with a communication channel. Such embodiments may be used with an Ethernet channel, including a wireless Ethernet channel. The communication channel may be part of a land based communication network or a wireless communication network. Indeed, embodiments of the present invention may well be implemented as part of any wireless system using multi-carrier wireless communication channels (e.g., orthogonal frequency-division multiplexing (OFDM), discrete multi-tone modulation (DMT), etc.), such as may be used within, without limitation, a wireless personal area network (WPAN), a wireless local area network (WLAN), a wireless metropolitan are network (WMAN), a wireless wide area network (WWAN), a cellular network, a third generation (3G) network, a fourth generation (4G) network, a universal mobile telephone system (UMTS), and similar communication systems.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present invention includes any other applications in which embodiment of the above structures and fabrication methods are used. The scope of the embodiments of the present invention should be determined with reference to the appended claims, along with the full scope of equivalents to which such claims are entitled.

What is claimed is:

1. A method comprising:
  applying a plurality of decoders to a code;
  applying reliability values to a decoder of the plurality of decoders such that the decoder receives the reliability values determined by and provided from only one other decoder of the plurality of decoders; and
  outputting a codeword from applying the plurality of decoders to the code; wherein applying reliability values to the decoder from the one other decoder includes applying reliability values to the decoder from the one other decoder that immediately precedes the decoder with the plurality of decoders arranged in a selected order.

2. A method comprising:
  applying a plurality of decoders to a code;
  applying reliability values to a decoder of the plurality of decoders such that the decoder receives the reliability values determined by and provided from only one other decoder of the plurality of decoders;
  outputting a codeword from applying the plurality of decoders to the code; and
  conducting one of more operations including inputting a channel reliability to only one of the decoders, the channel reliability used by the one decoder to determine reliability values to output or inputting a channel reliability to the plurality of decoders only at a first iteration of decoding the code or initializing the reliability values to zero in memory buffers to start decoding the code.

3. The method of claim 2, wherein the method includes inputting a channel reliability to the plurality of decoders only at a first iteration of decoding the code.

4. The method of claim 2, wherein the method includes initializing the reliability values to zero in memory buffers to start decoding the code.

5. A machine-readable medium that stores instructions, which when performed by a machine, cause the machine to:
apply a plurality of decoders to a code;
apply reliability values to a decoder of the plurality of decoders such that the decoder receives the reliability values determined by and provided from only one other decoder of the plurality of decoders; and
output a codeword from applying the plurality of decoders to the code; and
to conduct one of more operations including operations to:
apply the reliability values to the decoder from the one other decoder immediately preceding the decoder with the plurality of decoders arranged in a selected order; or
input a channel reliability to only one of the decoders at a first iteration of decoding the code, the channel reliability used by the one decoder to determine reliability values to output, the channel reliability input only at a first iteration of decoding the code; or
initialize the reliability values to zero in memory buffers to start decoding the code.

6. The machine-readable medium of claim 5, wherein the machine-readable medium includes instructions, which when performed by a machine, cause the machine to apply the plurality of decoders to a code having a plurality of supercodes, each decoder correlated to a different supercode, each decoder operating on the code by treating the code as the supercode to which it is correlated.

7. The machine-readable medium of claim 5, wherein the machine-readable medium includes instructions, which when performed by a machine, cause the machine to apply the reliability values to the decoder from the one other decoder immediately preceding the decoder with the plurality of decoders arranged in a selected order.

8. The machine-readable medium of claim 5, wherein the machine-readable medium includes instructions, which when performed by a machine, cause the machine to input a channel reliability to only one of the decoders at a first iteration of decoding the code, the channel reliability used by the one decoder to determine reliability values to output, the channel reliability input only at a first iteration of decoding the code.

9. The machine-readable medium of claim 5, wherein the machine-readable medium includes instructions, which when performed by a machine, cause the machine to initialize the reliability values to zero in memory buffers to start decoding the code.

10. The machine-readable medium of claim 5, wherein the instructions include instructions to apply the plurality of decoders to a low-density check code.

11. An apparatus comprising:
a decoder having a plurality of individual decoders, each individual decoder arranged to receive reliability values determined by and provided from only one other individual decoder of the plurality of individual decoders, wherein the decoder includes the plurality of individual decoders arranged in a selected order with the reliability values input to an individual decoder of the plurality of individual decoders from an immediately preceding individual decoder in the selected order or the decoder includes the decoder arranged to direct a channel reliability to one only of the individual decoders.

12. The apparatus of claim 11, wherein the decoder includes an input to receive a code, the code having a plurality of supercodes, each individual decoder correlated to a different supercode of the plurality of supercodes.

13. The apparatus of claim 12, wherein each individual decoder is arranged to operate on the code with the code treated as the supercode to which each individual decoder is correlated.

14. The apparatus of claim 11, wherein the decoder includes the plurality of individual decoders arranged in a selected order with the reliability values input to an individual decoder of the plurality of individual decoders from an immediately preceding individual decoder in the selected order.

15. The apparatus of claim 11, wherein the apparatus includes an interleaver between two individual decoders of the plurality of individual decoders.

16. The apparatus of claim 11, wherein the decoder includes the decoder arranged to direct a channel reliability to one only of the individual decoders.

17. The apparatus of claim 11, wherein the apparatus includes memory buffers to store the reliability values.

18. The apparatus of claim 11, wherein the decoder includes an output to provide a codeword decoded from a received low-density check code.

19. A system comprising:
a communication unit to receive a signal from a communication channel, the signal containing a code;
a parallel bus;
a controller communicatively coupled to the communication unit through the parallel bus; and
a decoder having a plurality of individual decoders, each individual decoder arranged to receive reliability values determined by and provided from only one other individual decoder of the plurality of individual decoders.

20. The system of claim 19, wherein the decoder includes the plurality of individual decoders arranged in a selected order with the reliability values input to an individual decoder of the plurality of individual decoders from an immediately preceding individual decoder in the selected order, and the decoder includes the decoder arranged to direct a channel reliability to one only of the individual decoders.

21. The system of claim 19, wherein the communication unit includes a network interface card.

22. The system of claim 19, wherein the network interface card includes a 10 GBase-T device.

23. The system of claim 19, wherein the decoder includes an output to provide a codeword decoded from a received low-density check code.

* * * * *